United States Patent
Patton et al.

(10) Patent No.: US 10,901,052 B1
(45) Date of Patent: Jan. 26, 2021

(54) ATOMIC MAGNETOMETER

(71) Applicant: AOSense, Inc., Sunnyvale, CA (US)

(72) Inventors: Brian R. Patton, San Francisco, CA (US); Micah Ledbetter, Sunnyvale, CA (US); Ethan Pratt, Santa Clara, CA (US)

(73) Assignee: AOSense, Inc., Sunnyvale, CA (US)

( * ) Notice: Subject to any disclaimer, the term of this patent is extended or adjusted under 35 U.S.C. 154(b) by 126 days.

(21) Appl. No.: 16/215,399

(22) Filed: Dec. 10, 2018

(51) Int. Cl.
*G01R 33/38* (2006.01)
*G01R 33/26* (2006.01)
*G01V 3/14* (2006.01)

(52) U.S. Cl.
CPC .............. *G01R 33/26* (2013.01); *G01V 3/14* (2013.01)

(58) Field of Classification Search
CPC ...... G01R 33/26; G01R 33/24; G01R 33/032; G01V 3/14; G01N 24/006
See application file for complete search history.

(56) References Cited

U.S. PATENT DOCUMENTS

| | | | | | |
|---|---|---|---|---|---|
| 4,450,407 A | * | 5/1984 | Kwon | .................... | G01C 19/62 324/300 |
| 8,421,455 B1 | * | 4/2013 | Hovde | .................... | G01R 33/26 324/305 |
| 9,869,731 B1 | * | 1/2018 | Hovde | .................... | G01R 33/032 |
| 2008/0106261 A1 | * | 5/2008 | Romalis | .............. | G01R 33/441 324/304 |
| 2009/0256561 A1 | * | 10/2009 | Ledbetter | ............ | G01R 33/282 324/305 |
| 2011/0025323 A1 | * | 2/2011 | Budker | .................. | G01R 33/26 324/304 |
| 2012/0176130 A1 | * | 7/2012 | Ledbetter | ............... | G01R 33/26 324/301 |
| 2016/0061913 A1 | * | 3/2016 | Kobayashi | ............ | G01R 33/26 324/305 |
| 2018/0348313 A1 | * | 12/2018 | Bulatowicz | ......... | G01R 33/032 |

* cited by examiner

*Primary Examiner* — Patrick Assouad
*Assistant Examiner* — Taqi R Nasir
(74) *Attorney, Agent, or Firm* — Van Pelt, Yi & James LLP

(57) ABSTRACT

An atomic magnetometer system includes a laser system, a cell, and an optics setup. The laser system is configured to generate a pump beam and a probe beam. The cell encloses an atomic vapor. The optics setup is configured to route the pump beam and the probe beam. The pump beam propagates along a path through the atomic vapor and the probe beam also propagates substantially along the path through the atomic vapor. The pump beam and the probe beam traverse the atomic vapor along two or more non-parallel directions. The interaction of the pump beam with the atomic vapor is modulated at or near harmonics of a magnetic resonance frequency.

21 Claims, 9 Drawing Sheets

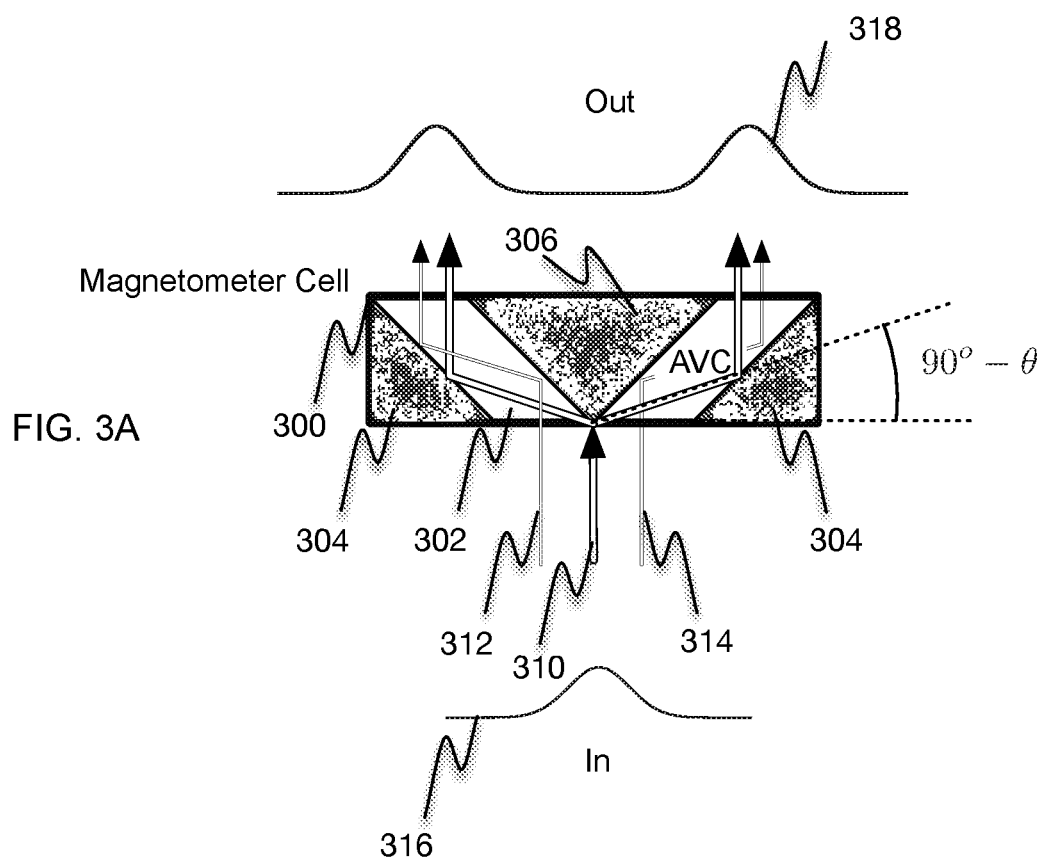
FIG. 3A
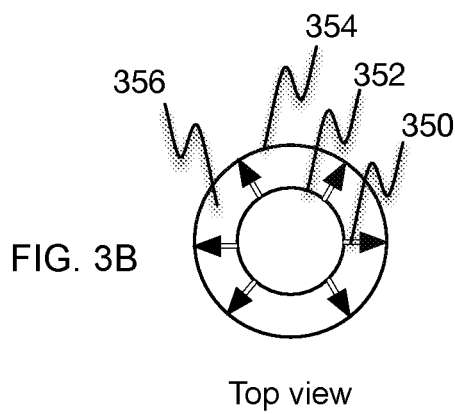
FIG. 3B  Top view
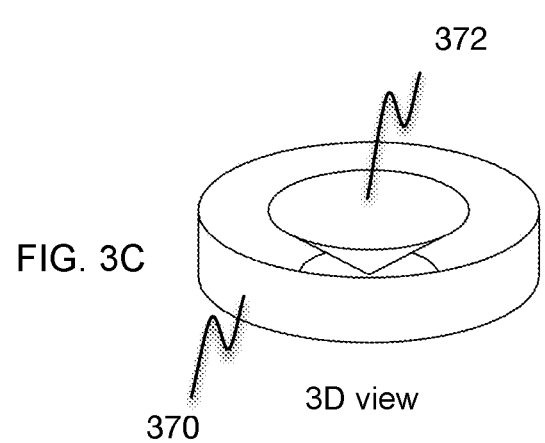
FIG. 3C  3D view

ATOMIC MAGNETOMETER

BACKGROUND OF THE INVENTION

Due to their remarkable sensitivity and precision, atomic magnetometers are ideally suited for applications requiring ultra-sensitive detection of magnetic fields such as geomagnetic mapping and navigation, geological and petroleum exploration, and detection of nuclear magnetic resonance (NMR) signals and bio-magnetic fields. Atomic sensors are typically based on a pair of discrete energy states where the sensing process proceeds in three main steps: first, the atoms are prepared in a well-defined state; second, the state of the atoms evolves in the presence of the field; and finally, by measuring the evolved state of the atom, a determination of the field is made. For atomic magnetometry, this typically requires preparation of the spin state of the atoms into a well-defined state (e.g., through optical pumping), excitation of a precessing spin coherence (e.g., via magnetic excitation or synchronous optical pumping), and observation of the net spin precession (e.g., typically through polarimetry of a detuned probe beam). This process can result in measurements of magnetic fields over ten billion times smaller than the Earth's magnetic field. However, most atomic magnetometers have dead zones in which the orientation of the magnetic field with respect to the sensor axis result in no signal as well as heading errors that depend on the orientation of the magnetic field with respect to the sensor axis. These dead zones and orientation-dependent errors make it difficult to use atomic magnetometers in a mobile environment especially for navigation applications where one needs to be able to measure the magnetic field without restrictions due to sensor orientation.

BRIEF DESCRIPTION OF THE DRAWINGS

Various embodiments of the invention are disclosed in the following detailed description and the accompanying drawings.

FIG. 3A is a block diagram illustrating an embodiment of a dead-zone-free atomic magnetometer cell.

FIG. 3B illustrates a top view of the conical multidirectional beam geometry of FIG. 3A.

FIG. 3C illustrates a 3D view of the conical multidirectional beam geometry of FIG. 3A.

DETAILED DESCRIPTION

Figure 1:
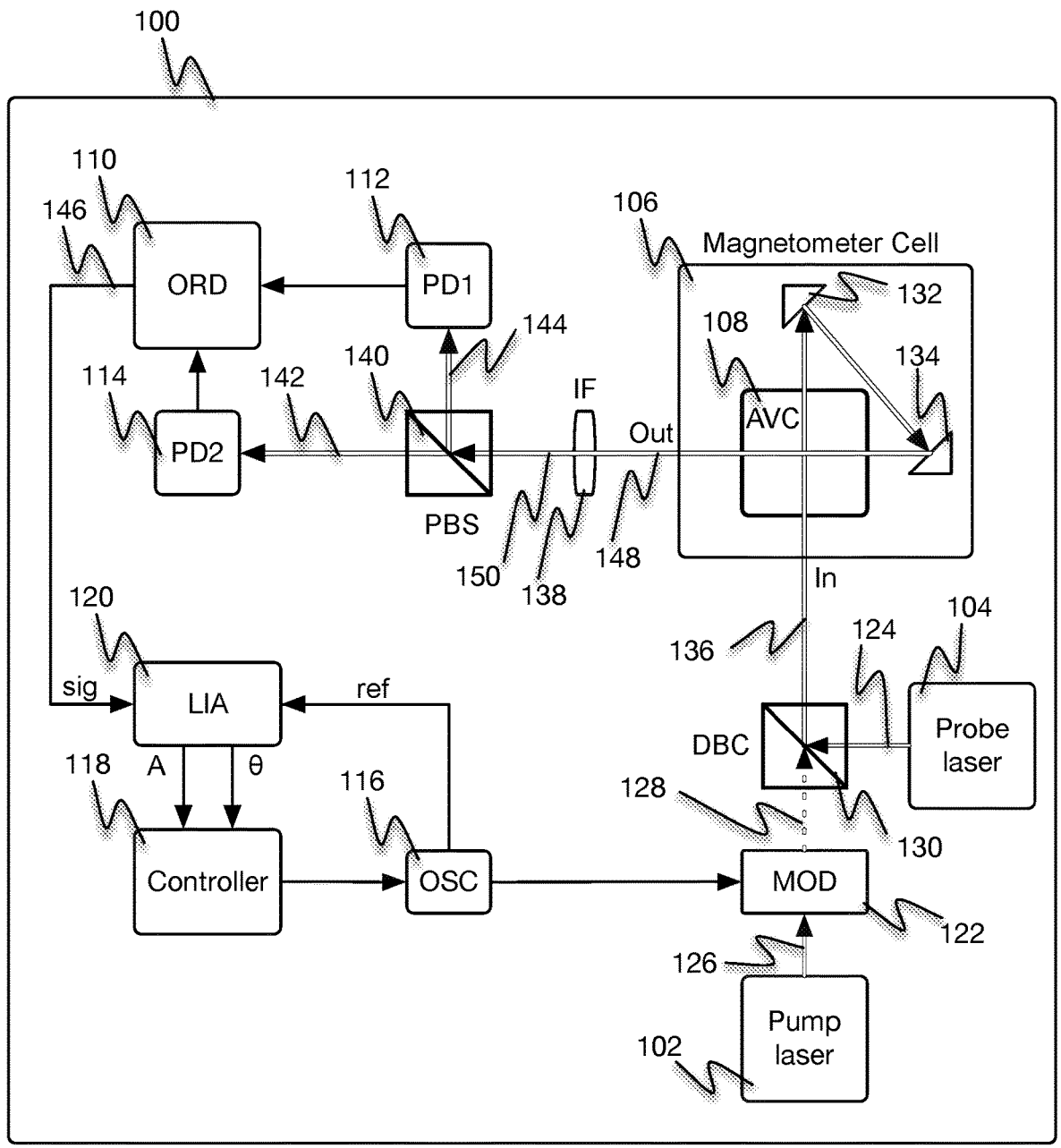
FIG. 1 is a block diagram illustrating an embodiment of a dead-zone-free atomic magnetometer capable of operating in geophysical magnetic field ranges.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A system for measuring the strength of a magnetic field using an atomic magnetometer where the responsivity of the device is minimally sensitive to its relative orientation to a magnetic field is disclosed. The system comprises a laser system that is configured to generate a pump beam and a probe beam. The system further comprises a magnetometer cell that encloses an atomic vapor. The system also comprises an optics setup that is configured to route the pump beam and the probe beam such that the pump beam propagates along a path through the atomic vapor. The probe beam also propagates substantially along the path through the atomic vapor. The pump beam and the probe beam are further configured to traverse the atomic vapor along two or more non-parallel directions, where an interaction of the pump beam with the atomic vapor is modulated at or near harmonics of a magnetic resonance frequency.

In its most general form, atom-based magnetometry requires preparation of the atom spin sample (e.g., through optical pumping), excitation of a precessing spin coherence (e.g., via magnetic excitation or synchronous optical pumping), and observation of the net spin precession (e.g., typically through polarimetry of a detuned probe beam). For geophysical field ranges (i.e., fields up to 100μT), the spin-precession frequency vL of alkali atoms is hundreds of kHz, meaning that static optical pumping cannot generate a coherently precessing net magnetization. The most common strategies for measurement of the magnetic-resonance frequency in this regime include: 1) nulling the magnetic field with coils so the atomic sample is in the zero-field regime, 2) static optical pumping with subsequent or simultaneous excitation of magnetic resonance using a radio frequency magnetic field, or 3) transverse optical pumping synchronized with the spin-resonance frequency to reinforce the precessing spin coherence.

Synchronous optical pumping is an established method for driving a spin coherence at nonzero magnetic fields, where the spin-precession frequency exceeds the relaxation line width of the atomic sample. This technique relies on the synchronous transfer of angular momentum from photons to atoms as these atoms' spins precess in a magnetic field. Synchronous optical pumping requires modulation of the interaction between the light source and the atoms; the parameter being modulated can include the light intensity, polarization, or detuning from the atomic optical transition. A separate, unmodulated probe beam experiences optical rotation of its polarization due to the precession of the atomic spins. Phase-sensitive detection of this probe polarization variation synchronous with the pump modulation yields a driven-oscillation signal characteristic of magnetic resonance.

The unknown field orientation in ambient environments poses serious challenges for scalar magnetometers—particularly since the sensor response varies as a function of orientation. Importantly, synchronous optical pumping along the field produces no coherent spin precession, and the magnetometer becomes insensitive to the magnetic field it is intended to measure. This results in a sensing "dead zone" when the pump vector is aligned with the field. Similarly, a linearly polarized probe beam experiences no optical rotation due to atomic spin precession orthogonal to the beam's propagation vector. As a result, a synchronously-pumped/statically-probed magnetometer will have dead zones whenever the ambient field is aligned with either the pump beam or the probe beam.

One potential solution to the presence of dead zones in the magnetometer response is to employ multiple beam propagation vectors interrogating different atom populations—either in separate cells or within the same cell. With the proper combination of beam orientations for each of the pump and probe beams, it is possible to ensure that one or more beam pairs always contributes a nonzero signal. Nevertheless, a second problem arises if the pump and probe beams are not mutually parallel within the atomic vapor: In any such configuration, the oscillating probe response exhibits a phase shift with respect to the driving pump modulation. This "geometric" phase shift varies as the sensor heading changes, resulting in a heading-dependent phase shift of the synchronously pumped magnetometer resonance. Such spurious phase shifts are troublesome in many detection schemes that rely on demodulation of the probe optical rotation signal, particularly in self-oscillating schemes where resonance phase shifts lead to systematic pulling of the magnetometer oscillation frequency. Moreover, this geometric phase shift prevents coherent addition of optical rotation signals for a probe beam passing through the atomic vapor along multiple directions: Each traversal of the vapor will impart optical rotation of the probe beam polarization at the synchronous pumping frequency, but the contributions may add destructively if the two rotation signals are out of phase, resulting in reduced or zero sensitivity.

A truly dead-zone-free atomic magnetometry architecture could be accomplished with a pump/probe beam geometry satisfying the following two conditions: 1) the modulated pump beam and the probe beam should be co-propagating everywhere within the atomic vapor, and 2) the combined beams should traverse the cell along multiple (e.g., two or more) non-parallel directions. Condition (1) ensures that the optical rotation signal of the probe beam is always in phase with the pump modulation regardless of the field direction, and that the optical rotation resulting from the multiple traversals through the atomic vapor add coherently. Condition (2) ensures that one or more of the beam pairs passing through the vapor result(s) in a nonzero magnetic-resonance signal.

FIG. 1 is a block diagram illustrating an embodiment of a dead-zone-free atomic magnetometer capable of operating in geophysical magnetic field ranges. In some embodiments, atomic magnetometer system 100 comprises a scalar magnetometer. In some embodiments, atomic magnetometer system 100 operates in a finite nonzero magnetic field. In some embodiments, atomic magnetometer system 100 operates with a spin-precession frequency that is larger than a spin relaxation rate.

In the example shown, atomic magnetometer system 100 comprises a laser system that is configured to generate pump beam 126 using pump laser 102 and probe beam 124 using probe laser 104, magnetometer cell 106 that encloses atomic vapor cell 108 (AVC), optical rotation detector 110 (ORD) that receives input from photodiode 112 (PD1) and photodiode 114, an oscillator 116 that is controlled by controller 118 with feedback from lock-in amplifier 120 (LIA), and modulator 122 (MOD) driven by oscillator 116 (OSC) that modulates the beam from pump laser 102. Atomic magnetometer system 100 allows for high precision measurements of the magnetic field without 'dead-zones'—where the orientation of the magnetic field with respect to the sensor axis result in no signal.

Pump beam 126 and probe beam 124 are tuned near the optical absorption line of the alkali species contained in atomic vapor cell 108. In some embodiments, atomic vapor cell 108 is referred to as an alkali vapor cell. In some embodiments, pump beam 126 and probe beam 124 are generated by different lasers. In some embodiments, pump beam 126 and probe beam 124 are generated by the same one laser. In some embodiments, the common one laser is sequentially tuned in wavelength and/or power to achieve pumping and probing of the alkali atomic vapor at different times. In some embodiments, a polarization-tuning element changes the polarization of an output of the one laser output to achieve pumping and probing of the alkali atomic vapor at different times. In some embodiments, pump beam 126 and probe beam 124 are tuned to two substantially different wavelengths, each of which is near an optical transition of an alkali vapor. In some embodiments, probe beam 124 is linearly polarized. In some embodiments, probe beam 124 is circularly polarized.

Oscillator 116 generates a train of pulses at a frequency selected to be near the magnetic-resonance frequency of the alkali atoms in an unknown magnetic field. Oscillator 116 drives a modulation of pump beam 126 via modulator 122 and outputs modulated pump beam 128. In some embodiments, pump beam 126 is amplitude modulated.

Oscillator 116 also serves as the reference for lock-in amplifier 120 (LIA). Unmodulated probe beam 124 and modulated pump beam 128 are combined via a dichroic beam combiner 130 (DBC) into co-propagating beams 136, then pass through atomic-vapor cell 108 along the same propagation vector. In some embodiments, probe beam 124 and pump beam 128 are substantially overlapping (e.g., a large fraction (e.g., 50%, 60%, 70%. 80%, 90%, etc.) of the two beams' energy spatially overlaps). Mirror 132 and mirror 134 steer co-propagating beams 136 to traverse the cell again in another direction and exits magnetometer cell 106 as beam 148. The reflected beams may overlap the incident co-propagating beams 136 in some portion of the atomic-vapor cell, or the mirrors 132 and 134 may be aligned so as to displace the reflected beam spatially such that the two beams traversing the atomic vapor along different directions do not overlap. In some embodiments, unmodulated probe beam 124 and modulated pump beam 128 are non-overlapping. In some embodiments, mirror 132 and mirror 134 are outside atomic-vapor cell 108. In some embodiments, mirror 132 and mirror 134 are inside atomic-vapor cell 108. After exiting magnetometer cell 106, pump beam 126 is blocked by an interference filter 138 (IF), and remaining probe beam 150 passes through polarizing beam splitter 140 (PBS). In some embodiments, the pump beam and the probe beam in co-propagating beam 136 are distinguished after traversing atomic-vapor cell 108 by dichroic optical elements.

In some embodiments, the polarization of probe beam 150 is resolved after passing through atomic vapor cell 108 and optical rotation or induced ellipticity is measured to detect spin precession within the atomic vapor. For example, orthogonally polarized output beams 142 and 144 from polarizing beam splitter 140 are detected by photodiode 114 and photodiode 112 respectively. Optical rotation detector 110 measures the differential photocurrent and yields voltage 146 (sig) indicative of the instantaneous polarization rotation that the atoms induce in the probe beam. In some embodiments, the power of probe beam 150 is measured after passing through atomic vapor cell 108 and absorption of probe beam 150 is used to detect spin precession within the atomic vapor.

Figure 2:
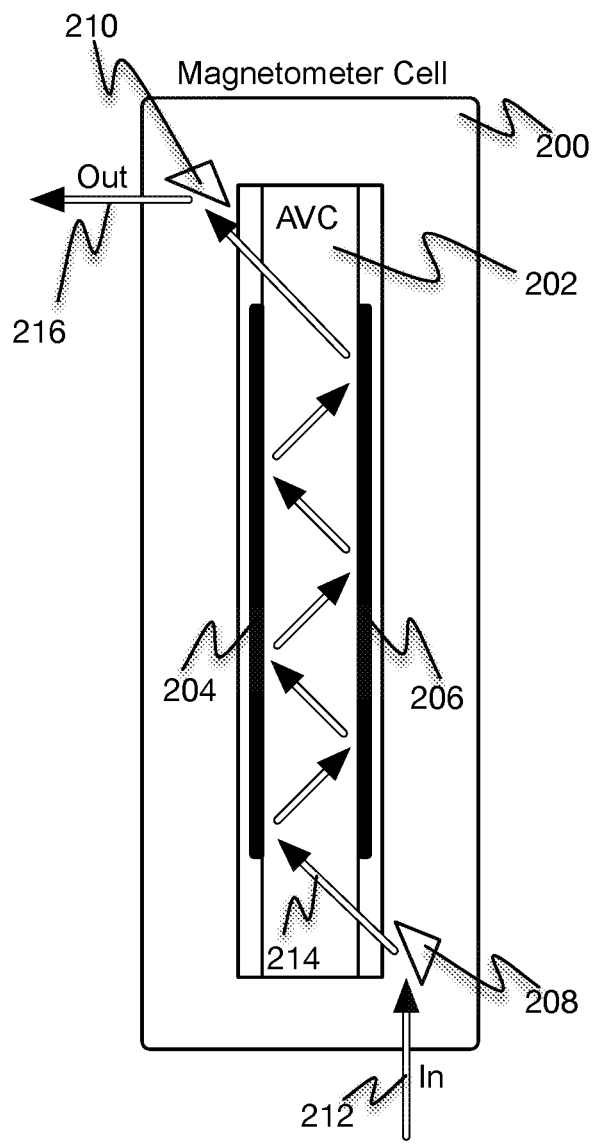
FIG. 2 is a block diagram illustrating an embodiment of a dead-zone-free atomic magnetometer cell.

FIG. 2 is a block diagram illustrating an embodiment of a dead-zone-free atomic magnetometer cell. In some embodiments, atomic magnetometer cell 200 implements atomic magnetometer cell 106 of FIG. 1. In the example shown, atomic magnetometer cell 200 comprises atomic vapor cell 202 (AVC), highly reflecting surface 204, highly reflecting surface 206, mirror 208, and mirror 210. Highly reflecting surface 204 and highly reflecting surface 206 are disposed to reflect a laser beam such that the beam trajectories span a plane in atomic vapor cell 202. In some embodiments, the laser path length and number of beam bounces can be increased or decreased by lengthening or shorting the cell. In some embodiments, the cell volume can be increased or decreased by increasing or decreasing the length of the cell in the transverse direction. Mirror 208 is disposed to deflect incoming laser beam 212 to laser beam 214 into atomic vapor cell 202. Mirror 210 is disposed to deflect laser beam 216 out of atomic magnetometer cell 200 in an appropriate direction.

FIG. 3A is a block diagram illustrating an embodiment of a dead-zone-free atomic magnetometer cell. In some embodiments, atomic magnetometer cell 300 implements atomic magnetometer cell 106 of FIG. 1. In the example shown, atomic magnetometer cell 300 comprises atomic vapor cell 302 (AVC), mirror 304, and mirror 306. Mirror 304 and mirror 306, are shown in cross section. In some embodiments, the cross-section view is of a circularly symmetric atomic magnetometer cell 300 (see FIG. 3C). Mirror 304 and mirror 306¥ are disposed to reflect a Gaussian pump/probe laser beam such that the pump/probe laser beam trajectory forms a radially expanding conical beam that fills the volume of atomic vapor cell 302 and propagates at an angle defined by θ while retaining cylindrical symmetry with respect to the incoming beam axis. For example, incoming beam 310, incoming beam 312, incoming beam 314 are representative beams of a Gaussian pump/probe laser beam intensity profile 316 where beam 310 represents the center intensity and beam 312 and beam 314 represent the off-center intensities. Beam 310, beam 312, beam 314 are reflected by mirror 306 and diverge radially from the center and expand along a conical trajectory with half-opening angle of the cone defined by angle θ. For example, if angle θ is 90°, the light is propagating outward in a disc. If it is 0°, the pump/probe beams are traveling along a single direction and the scheme is not free of dead zones. In some embodiments, the pump beam and the probe beam diverge and are co-propagating. In some embodiments, pump/probe beams diverge in a cone with angle θ=54.74° such that the total integrated spin-precession signal integrated over all pump and probe propagation vectors is independent of the ambient magnetic field direction. Beam 310, beam 312, beam 314 are reflected by radially symmetric mirror 304. Beam 310, beam 312, beam 314 exit atomic magnetometer cell 300 with an annular intensity profile 318. In some embodiments, the radially-expanding conical pump/probe beam is formed outside the atomic vapor cell by suitable optics. In some embodiments, incident beam 316 has been prepared in an annular or Laguerre-Gaussian mode prior to encountering mirror 306.

In some embodiments, the pump beam and the probe beam converge and are co-propagating. In some embodiments, the pump beam or the probe beam form a cone shape or conical surface shape. In some embodiments, the half opening angle of the cone shape is approximately equal to 54.7356°.

FIG. 3B illustrates a top view of the conical multidirectional beam geometry of FIG. 3A. Multidirectional beam geometry as shown by Poynting vectors 350 can be used within atomic vapor cell 356 to achieve dead-zone free responsivity with low heading error. In some embodiments, atomic vapor cell 356 implements atomic vapor cell 302 of FIG. 3A. In the example shown, Poynting vectors 350 of copropagating pump/probe beams are diverted by radially symmetric mirror 352. Edge of mirror 354 is associated with a conical mirror (e.g., mirror 304 and mirror 308 of FIG. 3A). In some embodiments, radially symmetric mirror 352 implements mirror 306 of FIG. 3A. In some embodiments, Poynting vectors 350 of copropagating pump/probe beams are created by a suitable optic.

FIG. 3C illustrates a 3D view of the conical multidirectional beam geometry of FIG. 3A. In some embodiments, mirror 370 implements mirror 304 of FIG. 3A. In some embodiments, mirror 372 implements mirror 306 of FIG. 3A.

Figure 4:
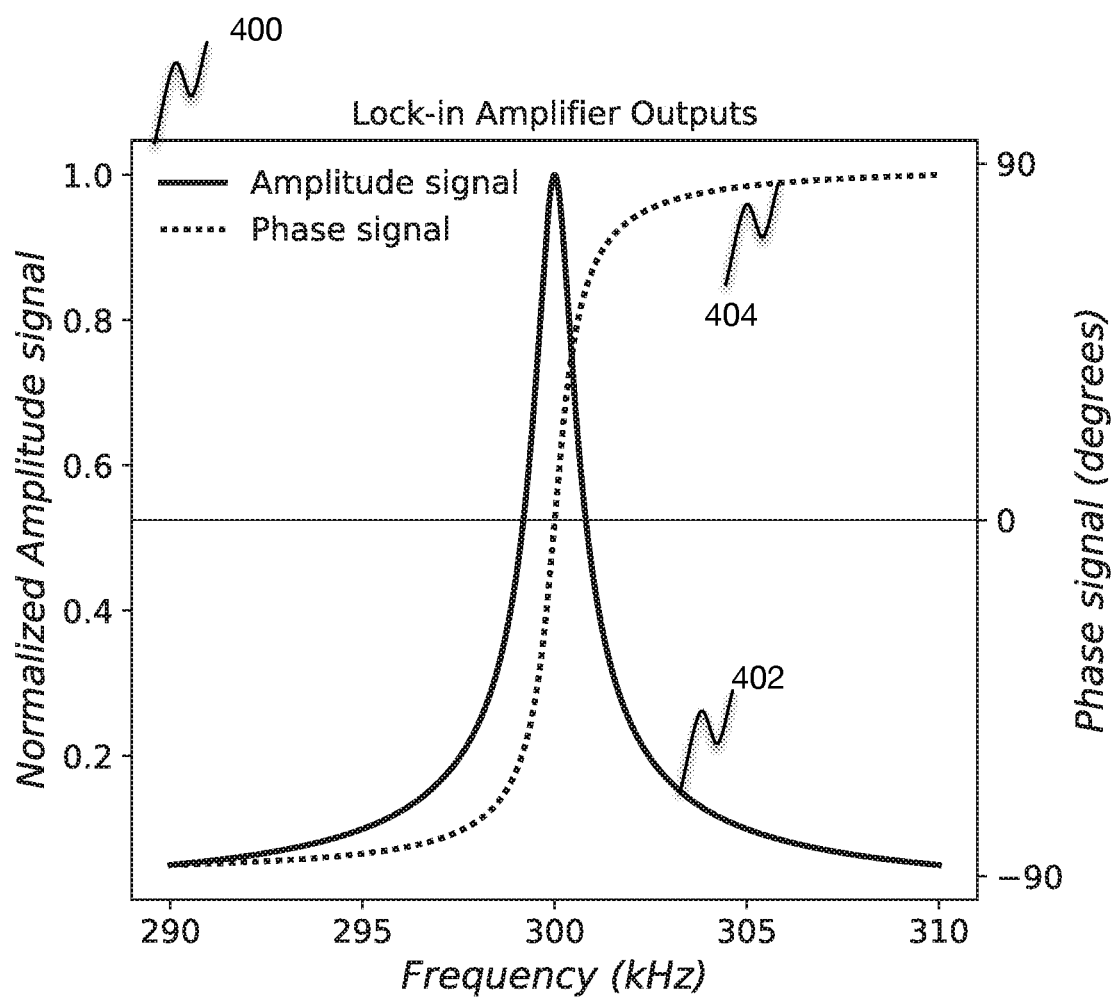
FIG. 4 is a graph illustrating an embodiment of representative magnetic-resonance curves as the frequency of a lock-in amplifier is varied.

FIG. 4 is a graph illustrating an embodiment of representative magnetic-resonance curves as the frequency of a lock-in amplifier is varied. In some embodiments, the lock-in amplifier is lock-in amplifier 120 of FIG. 1 which outputs amplitude A and phase θ into controller 118. In the example shown, graph 400 illustrates curve 402 and curve 404, where curve 402 is amplitude A and curve 404 is phase θ that is output from a lock-in amplifier while the pump beam frequency is swept through magnetic resonance. Together, curve 402 and curve 404 represent a fully phase-sensitive measurement of the probe beam optical rotation.

In the middle of curve 402 (amplitude), the response is maximum and curve 404 (phase) is zero. For example, if curve 404 (phase) is 0 degrees, the probe rotation signal is at its maximum when the pump beam is being pulsed at that particular frequency. Near the center of the resonance, the variation in curve 404 (phase) is roughly linear around the frequency offset from resonance. In some embodiments, instead of repeatedly sweeping through resonance to measure if the curves shift in frequency, a feedback loop is implemented to hold the frequency steady such that curve 404 (phase) remains at zero. This permits the system to precisely track ambient magnetic field changes by ensuring that the atoms are being driven at their magnetic resonance.

Figure 5:
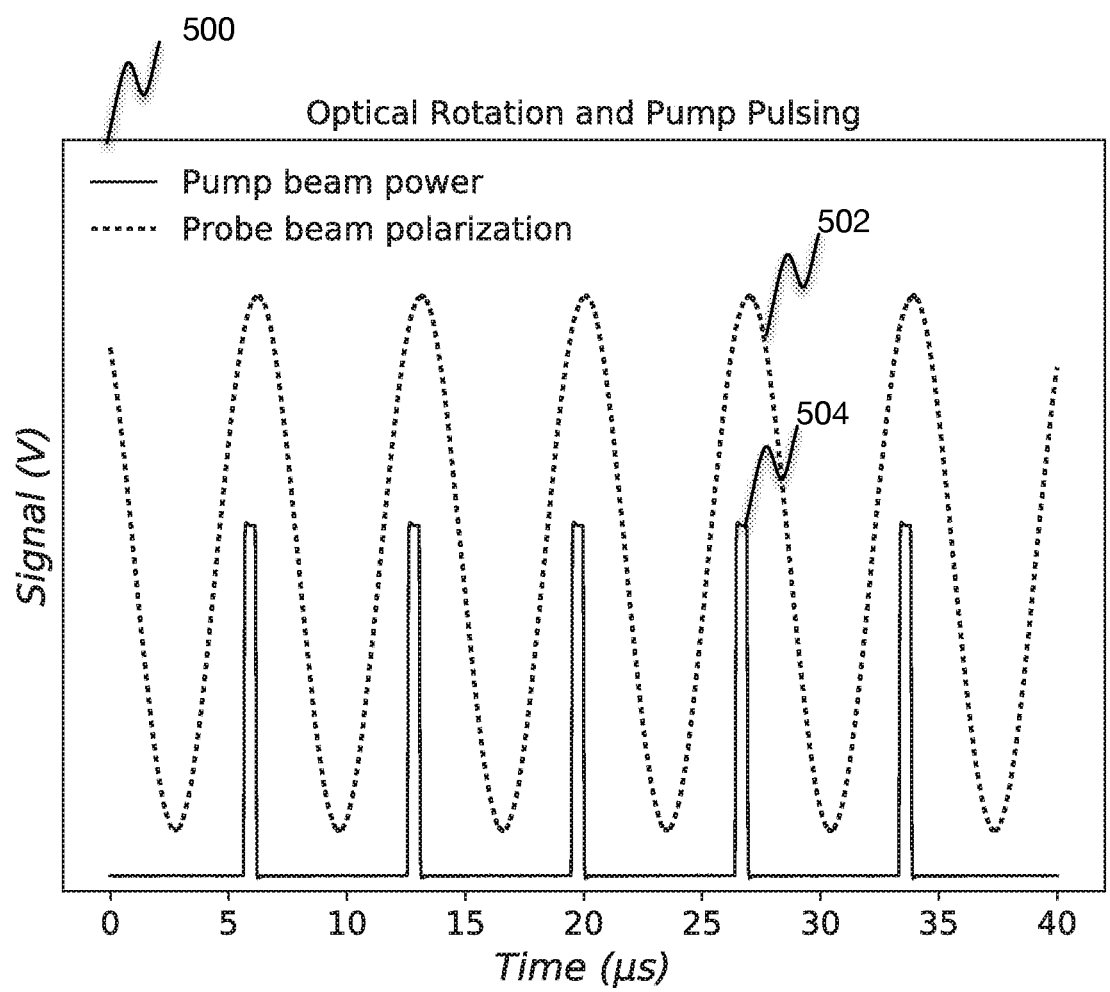
FIG. 5 is a graph illustrating an embodiment of the relative timing of the pump beam pulse sequence and the resulting probe beam polarization.

FIG. 5 is a graph illustrating an embodiment of the relative timing of the pump beam pulse sequence and the resulting probe beam polarization. In the example shown, graph 500 illustrates curve 502 and curve 504. Curve 504 shows the power of the pump beam, which is pulsed on and off with approximately 10% duty cycle. The pulse repetition rate of curve 504 is nominally near the magnetic resonance frequency. For example, if the pulse repetition rate is at or near the magnetic resonance frequency, the probe beam experiences significant optical rotation of its plane of polarization. The probe beam itself has steady optical power and is linearly polarized as it is incident upon the atomic vapor cell. The precessing atomic spins cause its polarization to rotate in the vapor and that rotation happens synchronously with the spin precession that is being driven by the modulated pump. Curve 502 shows the measurement of a sinusoidal probe polarization in response to the pump beam pulsing at the magnetic resonance frequency. The resonance phase can be determined by the time delay between the center of the pump pulse and the maximum of the probe rotation signal. For example, the probe beam polarization rotation can be detected by splitting the outgoing probe beam into two orthogonally polarized components. In some embodiments, the outgoing probe beam is split into two orthogonally polarized components using a polarizing beam-splitter cube. If the cube axes are rotated to 45 degrees with respect to the un-rotated (incident) probe beam polarization, the power in these two resulting beams will be nominally equal. Two photodetectors measure the power in these beams, and the difference in measured power (positive or negative) measures the positive or negative rotation of the probe polarization axis. In some embodiments, a polarization of the probe beam is resolved after the atomic vapor and optical rotation or induced ellipticity is measured to detect spin precession within the atomic vapor. In some embodiments, a power of the probe beam is measured after the atomic vapor and a probe beam's absorption is used to detect spin precession within the atomic vapor.

In some embodiments, the pump beam and probe beam are generated by the same one laser. In some embodiments, the common one laser is sequentially tuned in wavelength and/or power to achieve pumping and probing of the atomic vapor at different times. In some embodiments, a polarization-tuning element changes the polarization of an output of the one laser output to achieve pumping and probing of the atomic vapor at different times.

FIGS. 6A-F illustrate an example of a geometric phase shift that occurs in synchronously pumped magnetometers operating at nonzero field when the pump and probe beams are not co-propagating.

If the pump and probe beams are not mutually parallel within the atomic vapor (in contrast to the co-propagating beams in the disclosed system), the oscillating probe response exhibits a phase shift with respect to the driving pump modulation. This "geometric" phase shift varies as the sensor heading changes, resulting in a problematic heading-dependent phase shift of the synchronously pumped magnetometer resonance.

Figure 6A:
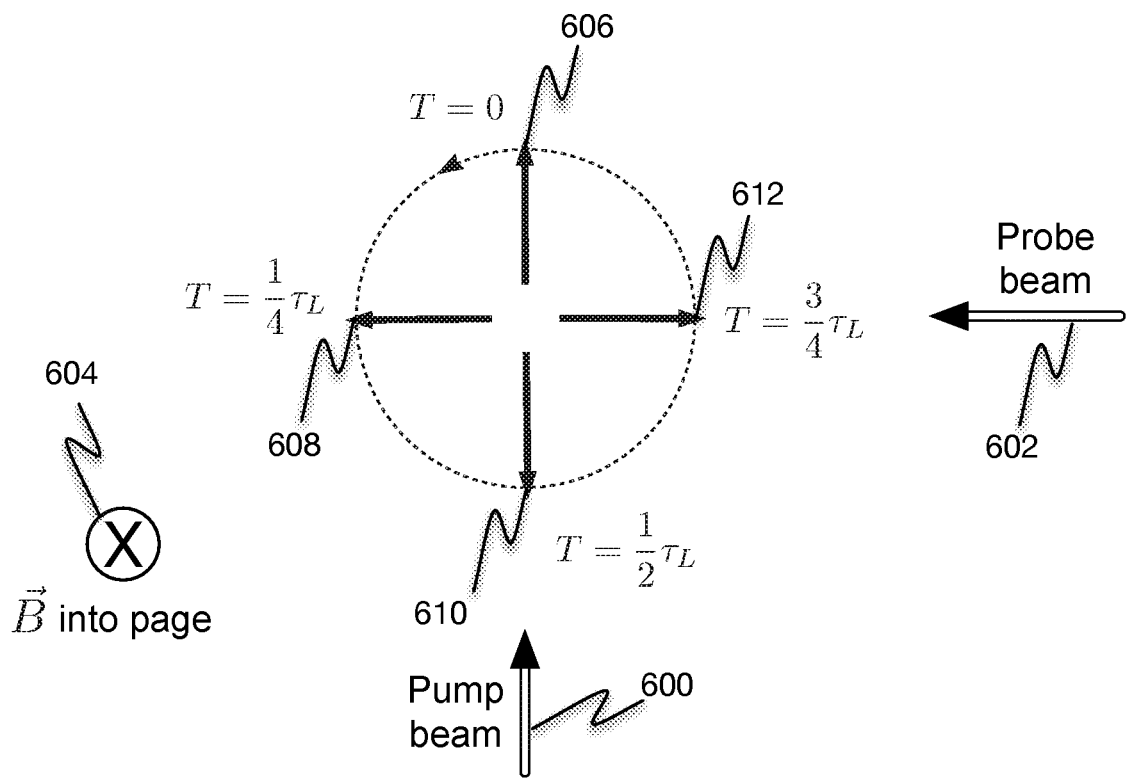
FIGS. 6A-F illustrate an example of a geometric phase shift that occurs in synchronously pumped magnetometers operating at nonzero field when the pump and probe beams are not co-propagating.
Figure 6B:
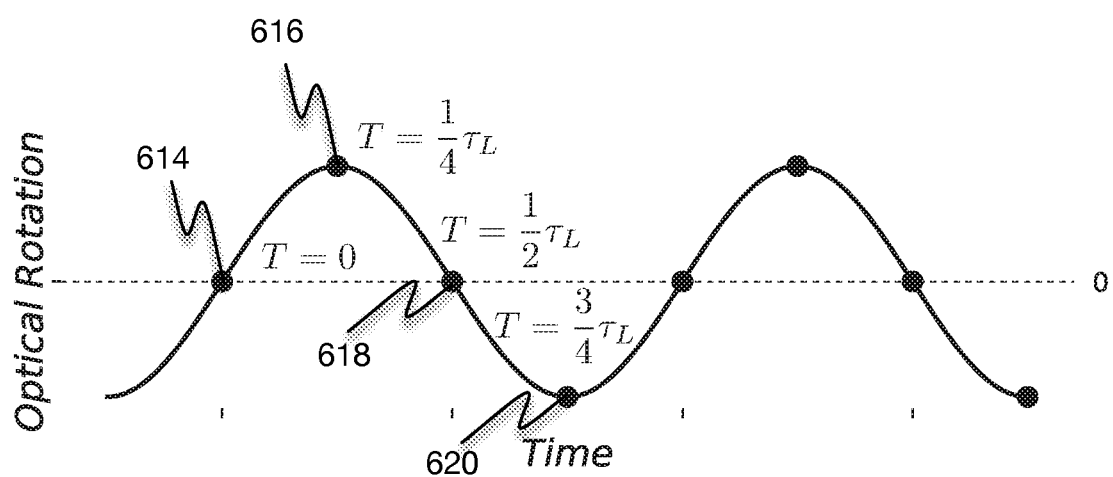
Figure 6C:
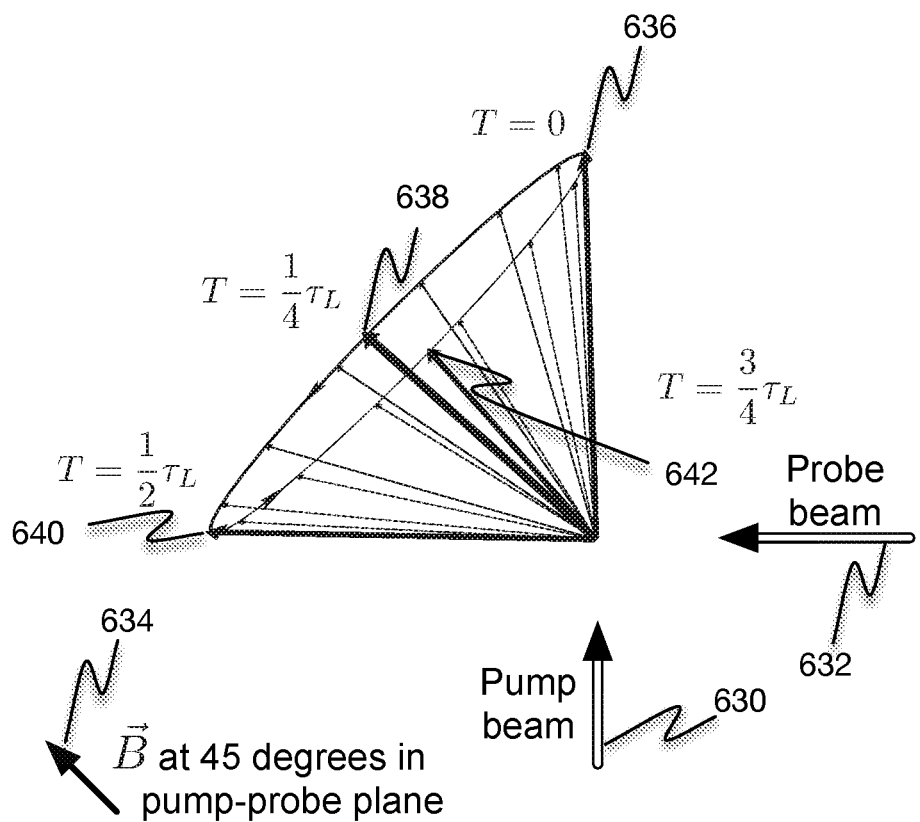
Figure 6D:
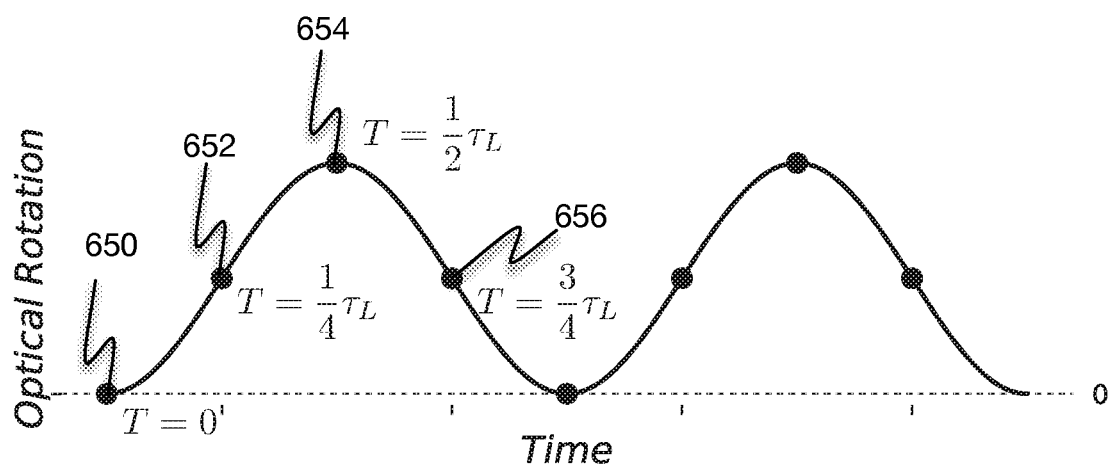

At the instance the pump beam is turned on at T=0, the spins of the atomic vapor are polarized parallel to the pump beam and precess in a cone about the magnetic field. The angle between the pump beam and the magnetic field determines the opening angle of the cone and the optical rotation is a dot-product of the probe beam and the spins at any given instance. FIGS. 6A and 6B show an example of the probe beam's optical rotation when the pump beam is orthogonal with respect to the magnetic field. FIGS. 6C and 6D show an example of the probe beam's optical rotation when the pump beam is at 45-degrees with respect to the magnetic field.

In FIG. 6A, pump beam 600 is orthogonal to the magnetic field B 604 and probe beam 602. In the example shown, pump beam 600 and probe beam 602 are in the plane of the page and the magnetic field B 604 points into the page. At T=0, spins 606 of the atomic vapor are polarized parallel to pump beam 600 and precess in a cone about the magnetic field B 604. In the example shown, the spin precession cone is a disc and has a full opening angle of 180 degrees. At a quarter cycle later 608 (at time $T=1/4\ \tau_L$) the spins have precessed 90-degrees. At a half-cycle after initialization 610, the spins have precessed 180-degrees. At ¾ of a full cycle 612, the spins have precessed 270-degrees.

In FIG. 6B, the probe's optical rotation 614 is zero at T=0 at the instance the pump beam is pulsed on. At a quarter cycle later, the probe's optical rotation 616 is at a maximum. At a half-cycle after initialization, optical rotation 618 is zero again. At ¾ of a full cycle it is negative. If T=0 occurs at the 614 pulse, there is a phase of the sign wave with respect to T=0; it starts off at zero and is a maximum a quarter cycle later.

In FIG. 6C, pump beam 630 is orthogonal to probe beam 632 and the magnetic field B 634 is at 45-degrees with respect to the pump beam 630 and in the pump-probe plane. At T=0, spins 636 of the atomic vapor are polarized parallel to pump beam 630 and precess in a cone about the magnetic field B 634. At a quarter cycle later 638 (at time $T=1/4\ \tau_L$) the spins have precessed 90-degrees. At a half-cycle after initialization 640, the spins have precessed 180-degrees. At ¾ of a full cycle 642, the spins have precessed 270-degrees.

In FIG. 6D, the probe's optical rotation 650 is zero at T=0 at the instance the pump beam is pulsed on. At a half-cycle after initialization the probe's optical rotation 654 is at a maximum. In contrast to FIG. 6B, where the magnetic field is orthogonal to the pump beam, the maximum negative optical rotation in FIG. 6C is at the point 650 at T=0. The change of the magnetic field with respect to the pump beam shifts the phase of the probe beam rotation by 90 degrees compared to the embodiment of FIG. 6B.

Given that the pump beam and the probe beam are fixed with respect to the alkali vapor by some optics, if the angle of the magnetic field is changed—or equivalently, if the sensor is rotated in the magnetic field, there will be a spurious phase shift. For example, if the pump beam is at 45 degrees with respect to the magnetic field as shown in FIG. 6C, the spins precess in a cone. At time T=0 in both cases (90 degrees and 45 degrees), there is zero optical rotation. For the 45-degree example (FIG. 6C) however, maximum optical rotation occurs at a half-cycle in rather than a quarter-cycle in as in the 90-degree case (FIG. 6A). This is what is referred to as a geometrical phase shift.

Such spurious phase shifts are troublesome in many detection schemes that rely on demodulation of the probe optical rotation signal, particularly in self-oscillating schemes where resonance phase shifts lead to systematic pulling of the magnetometer oscillation frequency. Moreover, this geometric phase shift prevents coherent addition of optical rotation signals for a probe beam passing through the atomic vapor along multiple directions: Each traversal of the vapor will impart optical rotation of the probe beam polarization at the synchronous pumping frequency, but the contributions may add destructively if the two rotation signals are out of phase, resulting in reduced or zero sensitivity.

Figure 6E:
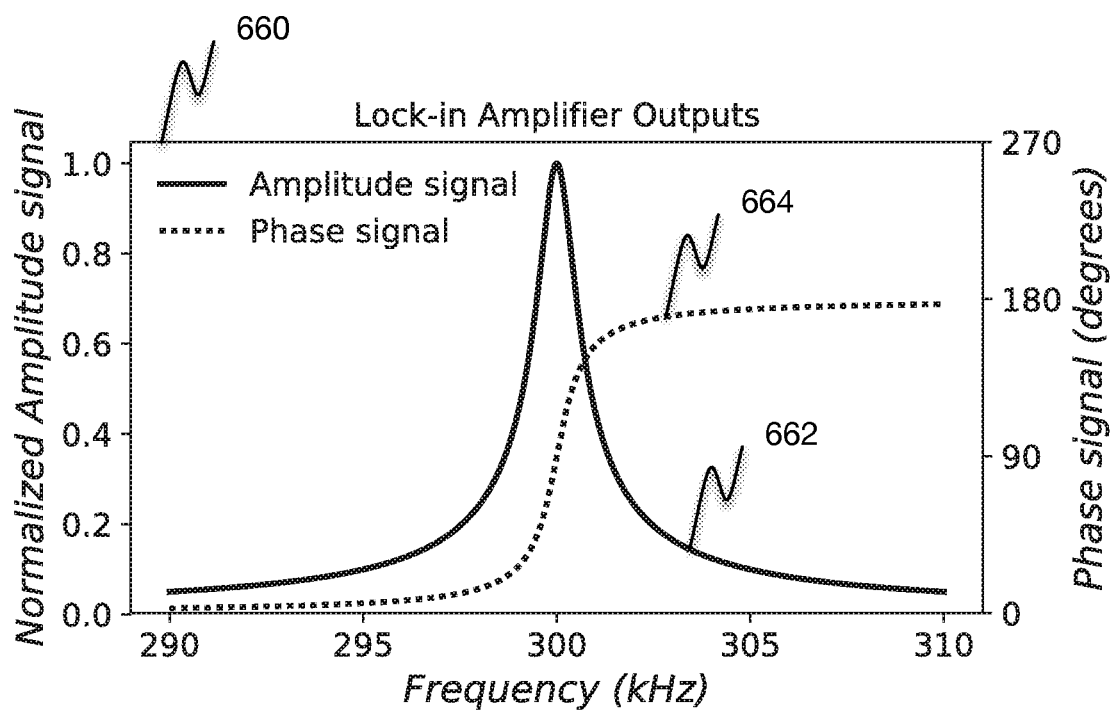
Figure 6F:
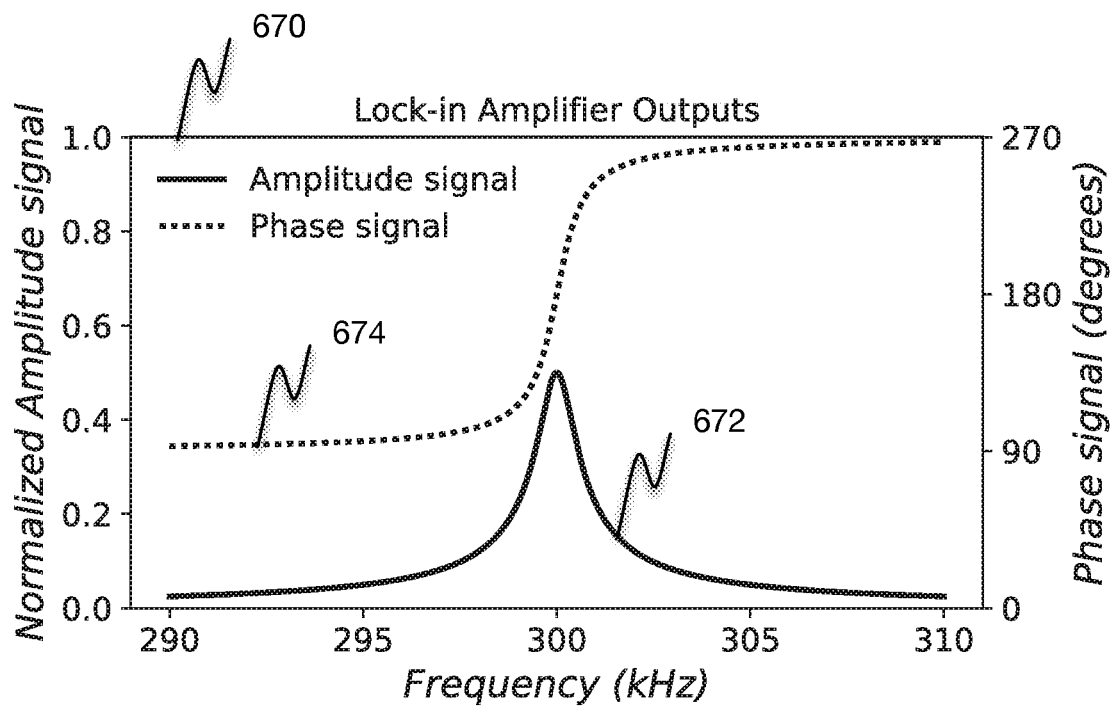

FIG. 6E summarizes the amplitude and phase response of FIGS. 6A and 6B. Plot 660 shows the amplitude signal 662 and the phase signal 664 as a function of frequency. FIG. 6F summarizes the amplitude and phase response of FIGS. 6C and 6D. Plot 670 shows the amplitude signal 672 and the phase signal 674 as a function of frequency. The phase in the resonance in this synchronously pumped case is determined by the time between when the pump is pulsed on and when the probe beam sees maximum optical rotation. Taken together, plot 660 and plot 670 show that the amplitude reduces and the phase shifts as the angle of the magnetic field with respect to the pump beam changes.

Figure 7:
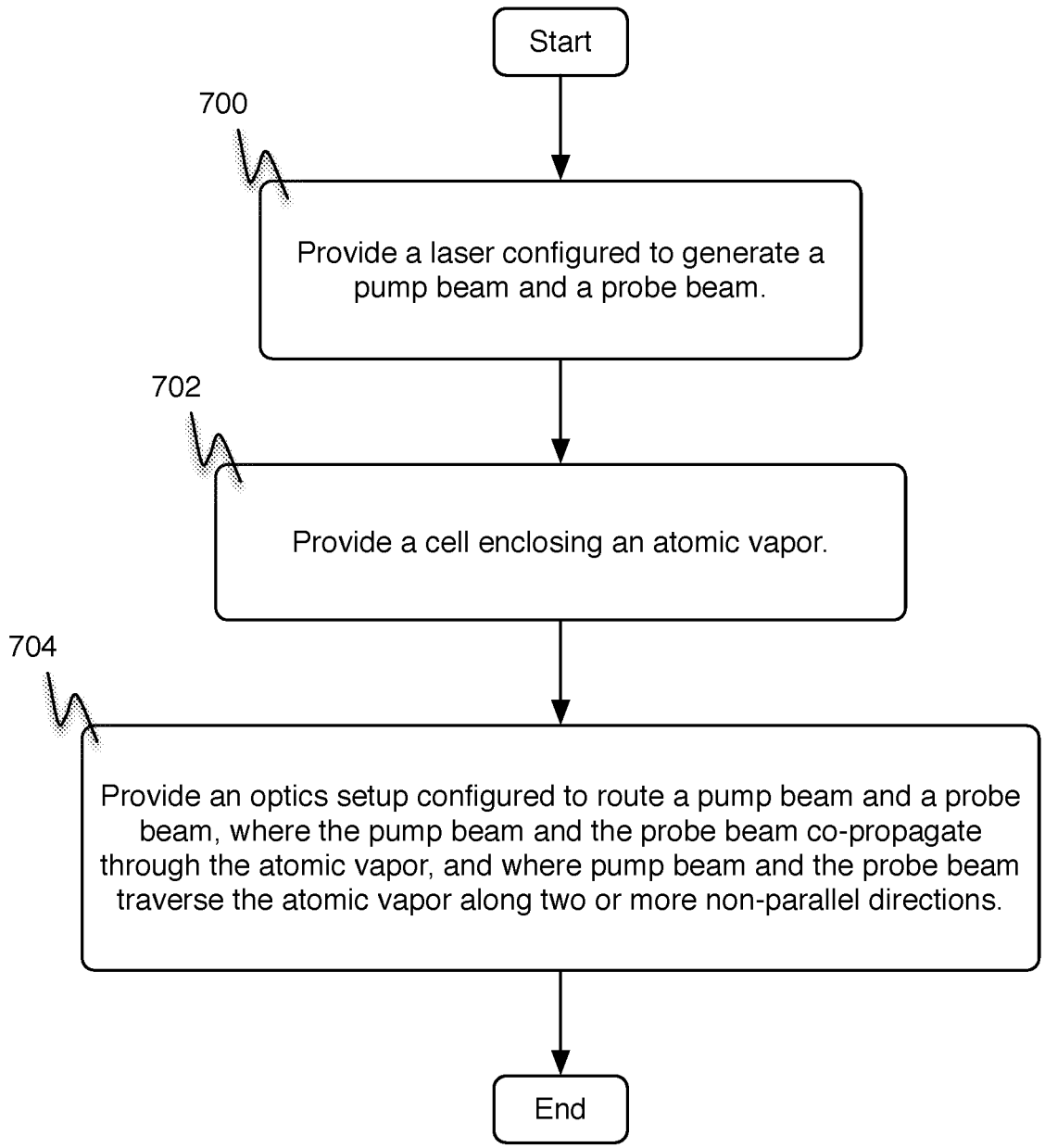
FIG. 7 is a flow diagram illustrating an embodiment of an atomic magnetometer system.

FIG. 7 is a flow diagram illustrating an embodiment of an atomic magnetometer system. In the example shown in 700, a laser configured to generate a pump beam and a probe beam is provided. For example, pump beam and probe beam are tuned near the optical absorption line of the alkali species contained in an atomic vapor cell. In some embodiments, pump beam and probe beam are generated by different lasers. In some embodiments, pump beam and probe beam are generated by the same one laser. In some embodiments, the common one laser is sequentially tuned in wavelength and/or power to achieve pumping and probing of the alkali atomic vapor at different times. In some embodiments, a polarization-tuning element changes the polarization of an output of the one laser output to achieve pumping and probing of the alkali atomic vapor at different times. In some embodiments, pump beam and probe beam are tuned to two substantially different wavelengths, each of which is near an optical transition of an alkali vapor. In some embodiments, probe beam is linearly polarized. In some embodiments, probe beam is circularly polarized.

In 702, a cell enclosing an atomic vapor is provided. In some embodiments, an atomic vapor fills an atomic vapor cell by heating a source of appropriate atoms to form a vapor. Any atoms with transitions amenable to atomic physics techniques using available lasers may be used; for example, alkali atoms such as cesium, rubidium, etc. In some embodiments, unmodulated probe beam and modulated pump beam are combined via a dichroic beam combiner into a co-propagating beam which then passes through atomic-vapor cell along the same propagation vector.

In 704, an optics setup configured to route a pump beam and a probe beam, where the pump beam and the probe beam co-propagate through the atomic vapor, and where pump beam and the probe beam traverse the atomic vapor along two or more non-parallel directions is provided. For example, the modulated pump beam and the probe beam are co-propagating everywhere within the atomic vapor and the combined beams traverse the cell along multiple (e.g., two or more) non-parallel directions. Co-propagating everywhere within the atomic vapor ensures that the relative phase of the probe polarization rotation and the pump modulation waveform is constant regardless of heading when the pump is modulated at the magnetic resonance frequency. Traversing the cell along multiple directions ensures that one or more of the beams pass through the vapor and result in a nonzero magnetic-resonance signal.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An atomic magnetometer system, comprising:
a laser system configured to generate a pump beam and a probe beam;
a cell enclosing an atomic vapor;
an optics setup configured to route the pump beam and the probe beam, wherein the pump beam propagates along a path through the atomic vapor and the probe beam also propagates substantially along the path through the atomic vapor,
wherein the pump beam and the probe beam enter the atomic vapor along a first direction, and
wherein the pump beam and the probe beam traverse the atomic vapor along a second direction, wherein the first direction and the second direction are non-parallel directions,
wherein an interaction of the pump beam with the atomic vapor is modulated at harmonics of a magnetic resonance frequency.

2. The atomic magnetometer system as in claim 1, wherein the pump beam is amplitude modulated.

3. The atomic magnetometer system as in claim 1, wherein the pump beam is frequency modulated.

4. The atomic magnetometer system as in claim 1, wherein the probe beam is not modulated at or near the magnetic resonance frequency.

5. The atomic magnetometer system as in claim 1, wherein the probe beam is linearly polarized.

6. The atomic magnetometer system as in claim 1, wherein the probe beam is circularly polarized.

7. The atomic magnetometer system as in claim 1, wherein a polarization of the probe beam is resolved after the atomic vapor and optical rotation or induced ellipticity is measured to detect spin precession within the atomic vapor.

8. The atomic magnetometer system as in claim 1, wherein a power of the probe beam is measured after the atomic vapor and a probe beam's absorption is used to detect spin precession within the atomic vapor.

9. The atomic magnetometer system as in claim 1, wherein the pump beam and the probe beam are generated by different lasers.

10. The atomic magnetometer system as in claim 9, wherein the pump beam and the probe beam are tuned to two substantially different wavelengths, each of which is near an optical transition of an alkali vapor.

11. The atomic magnetometer system as in claim 10, wherein the pump beam is blocked after traversing the cell enclosing the atomic vapor by an interference filter.

12. The atomic magnetometer system as in claim 1, wherein the pump beam and the probe beam are generated by a common laser.

13. The atomic magnetometer system as in claim 12, wherein the common laser is sequentially tuned in wavelength and/or power to achieve pumping and probing of the alkali atomic vapor at different times.

14. The atomic magnetometer system as in claim 12, wherein a polarization-tuning element changes a polarization of an output of the common laser to achieve pumping and probing of the atomic vapor at different times.

15. The system as in claim 1, wherein the atomic magnetometer system comprises a scalar magnetometer.

16. The atomic magnetometer system as in claim 15, wherein the atomic magnetometer system operates in a finite nonzero magnetic field.

17. The atomic magnetometer system as in claim 15, wherein the atomic magnetometer system operates with a spin-precession frequency that is larger than a spin relaxation rate.

18. The atomic magnetometer system as in claim 1, wherein an optic expands or focuses the pump beam and the probe beam to cause each of them to span multiple propagation directions.

19. The atomic magnetometer system as in claim 18, wherein a path of a converging beam or a diverging beam generated by the pump beam and the probe beam can be described as having a cone shape or a conical surface.

20. The atomic magnetometer system as in claim 19, wherein a half opening angle of the cone shape is approximately equal to 54.7356°.

21. A method for an atomic magnetometer system, comprising:
   providing a laser configured to generate a pump beam and a probe beam;
   providing a cell enclosing an atomic vapor; and
   providing an optics setup configured to route the pump beam and the probe beam, wherein the pump beam and the probe beam co-propagate through the atomic vapor, wherein the pump beam and the probe beam enter the atomic vapor along a first direction and wherein pump beam and the probe beam traverse the atomic vapor along a second direction, wherein the first direction and the second direction are non-parallel directions.

* * * * *